United States Patent
Hamada et al.

(10) Patent No.: US 6,373,291 B1
(45) Date of Patent: Apr. 16, 2002

(54) PASS TRANSISTOR LOGIC CIRCUIT FOR REDUCING POWER CONSUMPTION

(75) Inventors: Mototsugu Hamada, Yokohama; Tadahiro Kuroda, Tokyo-To, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/668,163

(22) Filed: Sep. 25, 2000

(30) Foreign Application Priority Data

Sep. 27, 1999 (JP) .............................. 11-273338

(51) Int. Cl.[7] ..................... H03K 19/0944; H03K 19/20
(52) U.S. Cl. ..................... 326/113; 326/119; 326/122
(58) Field of Search .......................... 326/113, 83, 112, 326/119, 121

(56) References Cited

U.S. PATENT DOCUMENTS

| | | | |
|---|---|---|---|
| 4,541,067 A | * 9/1985 | Whitaker | 364/716 |
| 5,568,069 A | * 10/1996 | Chow | 326/113 |
| 5,808,483 A | * 9/1998 | Sako | 326/113 |
| 5,923,189 A | * 7/1999 | Sasaki et al. | 326/113 |
| 5,955,912 A | * 9/1999 | Ko | 327/410 |

OTHER PUBLICATIONS

Lee et al., "32–Bit Adder Design and Comparison with NMOS/CMOS–TG Pass–Transistor Logic," DA Symposium (1998), pp. 65–70.

* cited by examiner

Primary Examiner—Michael Tokar
Assistant Examiner—Daniel D. Chary
(74) Attorney, Agent, or Firm—Finnegan, Henderson, Farabow, Garrett & Dunner, L.L.P.

(57) ABSTRACT

A semiconductor integrated circuit comprises a first MOS transistor of a first conductivity type having one of its source and drain connected to a first signal input node, having the other thereof connected to a signal output node, and receiving a select signal at its gate; a second MOS transistor of a second conductivity type in parallel connection with the first MOS transistor, and receiving an inverted signal of the select signal; and a third MOS transistor of the second conductivity type having one of its source and drain connected to a second signal input node, having the other thereof connected to the signal output node, and receiving the select signal at its gate, the semiconductor integrated circuit being configured to satisfy the relation as expressed by an inequality W1>W2 where W1 and W2 are gate widths of the first and second MOS transistors.

16 Claims, 4 Drawing Sheets

PASS TRANSISTOR LOGIC CIRCUIT FOR REDUCING POWER CONSUMPTION

CROSS REFERENCE TO RELATED APPLICATIONS

The subject application is related to subject matter disclosed in Japanese Patent Application No. H11-273338 filed on Sep. 27, 1999 in Japan to which the subject application claims priority under Paris Convention and which is incorporated herein by reference.

BACKGROUND OF THE INVENTION

1. Field of the Invention

The present invention relates to a semiconductor integrated circuit, and more particularly, it relates to a pass-transistor logic circuit.

2. Related Background Art

One of approaches for reducing consumption power in large scale integrated circuit (LSI) is a pass-transistor logic circuit. Lee et al. in Kobe University compares logical units of pass-transistors configured with N-channel MOS transistors to logical units of pass-transistors configured with transmission gates (TG) in an article titled "Designs of Adders on NMOS and CMOS-TG Pass-transistor Logics and Comparative Evaluation", DA Symposium '98. They conclude that ". . . as a result of comparison of NMOS with CMOS-TG, NMOS showed good delay performance on pass-input while CMOS-TG showed good delay performance on select input . . . " in "Chap. 5: The Conclusions" of the article. In other words, they evaluate that it is desirable that NMOS pass-transistor logic may be used at locations where delay of signals acting as pass-input cause some trouble while CMOS-TG pass-transistor logic may be used at locations where the delay of signals acting as select input cause some trouble, and preferably, two types of logics may be used depending upon terms and locations in which they are to be appropriately used, respectively.

However, using those two types of cells results in the cells in circuit deign increasing in number and in the circuit design encountering a problem of conditional determination on individual use of the cells, and preferably, simply one type of cells are used.

SUMMARY OF THE INVENTION

The present invention is directed to overcoming the above mentioned disadvantages, and therefore, it is an object of the present invention to provide pass-transistor logic circuits that commonly have features of NMOS pass-transistor logic enabling pass-input signals to be transmitted faster and features of CMOS-TG pass-transistor logic enabling select input signals to be transmitted faster.

Semiconductor integrated circuit according to the present invention comprises a first MOS transistor of a first conductivity type receiving a select signal at its gate, a second MOS transistor of a second conductivity type in parallel connection with the first MOS transistor and receiving an inverted signal of the select signal at its gate, and third MOS transistors of the second conductivity type receiving the select signals at their respective gates, and the semiconductor integrated circuit is configured to satisfy the relation as expressed by an inequality, W1>W2, where W1 and W2 are gate widths of the first and second MOS transistors, respectively, thereby providing a pass-transistor logic circuit that enables output signal to alter quickly upon alteration of the select input signal, enables the output signal to alter quickly upon alteration of the pass-input signals, and enables the logic circuit itself to be implemented in a reduced area compared with the prior art CMOS-TG pass-transistor logic circuit.

The semiconductor integrated circuit configured as mentioned above further comprises fourth MOS transistors of the first conductivity type in parallel connection with the third MOS transistors and receiving the inverted signals at its gate, and the semiconductor integrated circuit is configured to satisfy the relation as expressed by an inequality, W3>W4, where W3 and W4 are gate widths of the third and fourth MOS transistors, respectively, thereby attaining the similar effects to those as mentioned above in paths of pass-input signals.

The semiconductor integrated circuit configured as mentioned above may include an inverter for producing the inverted signals.

The inverter includes a fifth MOS transistor of the first conductivity type and a sixth MOS transistor of the second conductivity type which are connected in series with each other between a supply potential node and a ground potential node and receive the select signal at their respective gates, and the semiconductor integrated circuit is also configured to satisfy the relation as expressed by an inequality, (W6/L6)>2×(W5/L5), where W5 and W6 are gate widths of the fifth and sixth MOS transistors, respectively, while L5 and L6 are gate lengths thereof, respectively, thereby providing a pass-transistor logic circuit that enables output signal to alter more quickly upon alteration of the select input signal, enables the output signal to alter quickly upon alternation of the pass-input signals, and enables the logic circuit itself to be implemented in a reduced area compared with the prior art CMOS-TG pass-transistor logic circuit.

The configuration of the inverter as mentioned above enables the similar effects to be accomplished when it is applied to the NMOS pass-transistor logic circuit and to the CMOS-TG pass-transistor logic circuit comprising primary pass-input signal transmission elements of two N-channel MOS transistors.

Specifically, the semiconductor integrated circuit comprises a first MOS transistor of a first conductivity type receiving a select signal at its gate, an inverter having a second MOS transistor of the first conductivity type and a third MOS transistor of a second conductivity type that are in serial connection between a supply potential node and a ground potential node and that receive the select signal at their respective gates, to produce an inverted signal of the select signal, and a fourth MOS transistor of the first conductivity type that receives the inverted signal at its gates, and the semiconductor integrated circuit is configured to satisfy the relation as expressed by an inequality, (W3/L3)>2×(W2/L2), where W2 and W3 are gate widths of the second and third MOS transistors, respectively, while L2 and L3 are gate lengths thereof, respectively, thereby enabling the similar effects to those as mentioned above to be accomplished.

DESCRIPTION OF THE PREFERRED EMBODIMENTS

Hereinafter, preferred embodiments of pass-transistor logic circuit of a semiconductor integrated circuit according to the present invention will be described in details with reference to the appended drawings.

As stated above, the pass-transistor logic circuit is one of solutions of power-saving technology in LSI, and especially, the pass-transistor logic circuit of single-rail logic is noteworthy as an approach that allows a very small number of transistors to achieve logic circuit.

The present invention is the one related to the pass-transistor logic circuit, having the following features: (1) quick alteration of an output signal in response to alteration in a select signal, (2) quick alteration of the output signal in response to alteration in pass-input signals, and (3) capability of implementing the transistor logic circuit itself in a reduced area compared with the prior art CMOS-TG pass-transistor logic circuit.

Figure 1:
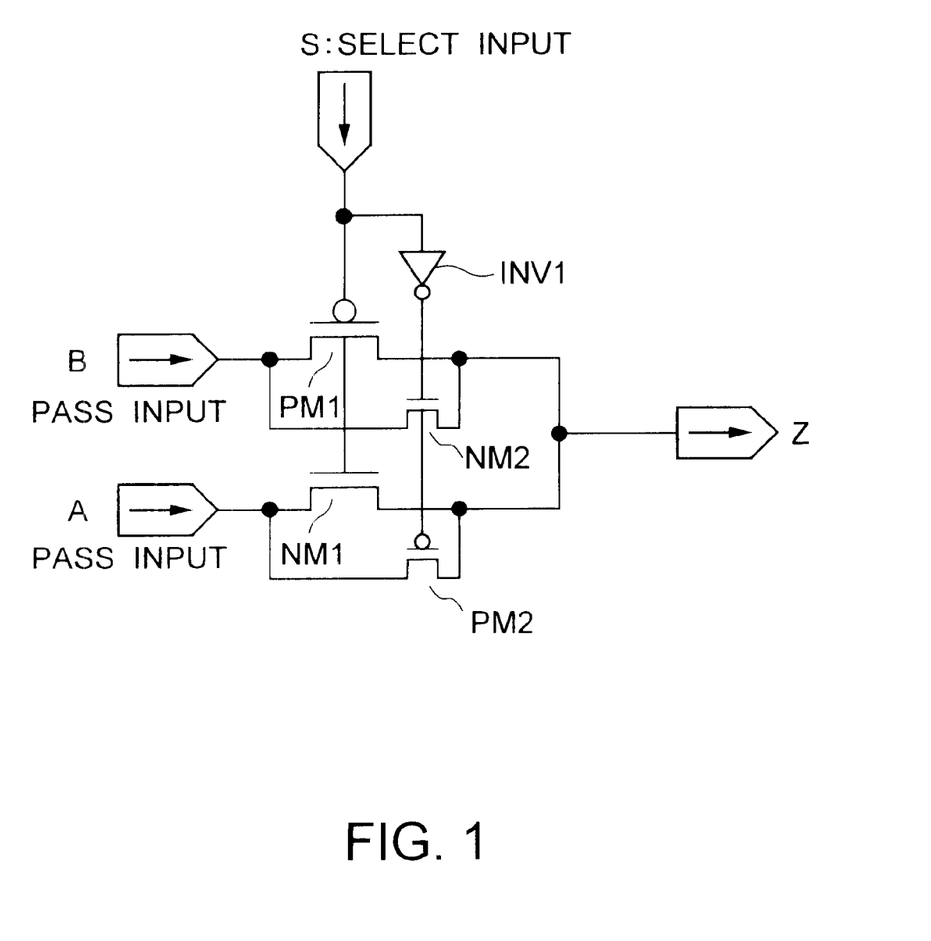
FIG. 1 is a circuit diagram illustrating an arrangement of pass-transistor logic circuit of a first preferred embodiment according to the present invention.

FIG. 1 is a circuit diagram showing an arrangement of the pass-transistor logic circuit of a first preferred embodiment according to the present invention.

The pass-transistor logic circuit of the first preferred embodiment according to the present invention as depicted in FIG. 1 comprises a first N channel MOS transistor NM1 having its drain connected to a pass signal input node A, its gate connected to a select signal input node S, its source connected to a signal output node Z, a first P channel MOS transistor PM1 having its source connected to a pass signal input node B, its gate connected a select signal input node S, and its drain connected to the signal output node Z, a second P channel MOS transistor PM2 in parallel connection with the first N channel MOS transistor NM1 and having its gate connected to the select signal input node S via an inverter INV1, and a second N channel MOS transistor NM2 in parallel connection with the first P channel MOS transistor PM1 and having its gate connected to the select signal input node S via the inverter INV1, and the pass-transistor logic circuit is configured to satisfy the relations as expressed by inequalities, $W_{NM1} > W_{PM2}$ and $W_{PM1} > W_{NM2}$, where $W_{NM1}$ and $W_{NM2}$ are gate widths of the first and second N channel MOS transistors NM1 and NM2, respectively, while $W_{PM1}$ and $W_{PM2}$ are gate widths of the first and second P channel MOS transistors PM1 and PM2, respectively, to serve as two-input one-output multiplexer circuit.

As described in the article, p. 67, by Lee et al., the prior art CMOS-TG pass-transistor logic circuit often uses P channel MOS transistors and N channel MOS transistors of approximately the same dimensions to configure transmission gates. Alternatively, gate widths of the P channel MOS transistors are often twice as large as the gate widths of the N channel MOS transistors since mobility of holes in silicon is approximately a half of the mobility of electrons therein.

The pass-transistor logic circuit of the first preferred embodiment according to the present invention uses both the N channel MOS transistors and P channel MOS transistors, where the gate widths $W_{NM1}$ and $W_{PM1}$ of the first N channel MOS transistor NM1 and the first P channel MOS transistor PM1 receiving the noninverted select input signal S at their respective gates are set relatively large while the gate widths $W_{NM2}$ and $W_{PM2}$ of the second N channel MOS transistor NM2 and the second P channel MOS transistor PM2 receiving inverted signal of the select input signal S at their respective gates are set relatively small. In other words, each of those MOS transistors is configured to satisfy the relations as expressed by the inequalities, $W_{NM1} > W_{PM2}$ and $W_{PM1} > W_{NM2}$.

When pass-input signals A and B are altered, the first N channel MOS transistor NM1 and the first P channel MOS transistor PM1 primarily transmit signals. Since, in the prior art CMOS-TG pass-transistor logic circuit, the second N channel MOS transistor NM2 and the second P channel MOS transistor PM2 receiving the inverted signals of the select input signal S at their respective gates are dimensioned relatively large so as to be approximately as large as the first N channel MOS transistor NM1 and the first P channel MOS transistor PM1 receiving the noninverted select input signals S at their respective gates, the second N channel MOS transistor NM2 and the second P channel MOS transistor PM2 have large diffusion capacities, respectively, and hence, the alteration of the output signal Z is slow in response to the alteration in the pass-input signals A and B, respectively.

In contrast, since, in the pass-transistor logic circuit of the first embodiment according to the present invention, the second N channel MOS transistor NM2 and the second P channel MOS transistor PM2 have the gate widths reduced to be relatively small, the diffusion capacities thereof are also reduced, and hence, delay of signal transmission depending upon the diffusion capacities are also reduced. On the other hand, unlike the NMOS pass-transistor logic circuit, the pass-transistor logic circuit of this embodiment causes no trouble of leak current occurring in load circuit due to threshold voltage drop. Consequently, a feedback P channel MOS transistor required in the load circuit of the prior art NMOS pass-transistor logic circuit is unnecessary (see the article by Lee et al.).

A case where the select input signal S is altered will now be discussed. When the select input signal S turns from L (Low) level to H (High) level, the delay of the signal depends upon the first N channel MOS transistor NM1. The first N channel MOS transistor NM1 at OFF state is turned ON to transmit the pass-input signal A. When the select input signal S turns from H level to L level, the delay of the signal depends upon the first P channel MOS transistor PM1. The first P channel MOS transistor at OFF state is turned ON to transmit the pass-input signal B.

In each of the above mentioned situations, although the second P channel MOS transistor PM2 and the second N channel MOS transistor NM2 are turned ON a certain period of time, which is equivalent to a period of time of the delay of the inverter INV1 for producing the inverted signal of the select input signal S, after the first N channel MOS transistor NM1 and the first P channel MOS transistor PM1 are turned ON, the output signal from the inverter is altered when the first N channel MOS transistor NM1 and the first P channel MOS transistor PM1 cause the output signal Z from the logic unit in the pass-transistor circuit to exceed a circuit threshold value of the inverter INV1 which is an element of the load circuit, and therefore, the logic unit affects the delay of signals to reduced extent.

As has been described, configuring the pass-transistor logic circuit to satisfy the relations as expressed by the inequalities, $W_{NM1} > W_{PM2}$ and $W_{PM1} > W_{NM2}$, in terms of the gate widths of the MOS transistors, or the components of the transistor logic circuit, enables the pass-transistor logic circuit to have the advantages of both the CMOS-TG pass-transistor logic circuit and NMOS pass-transistor logic circuit. In other words, the pass-transistor logic circuit of the first preferred embodiment according to the present invention enables the output signal to alter rapidly in response to the alteration in the select input signal, enables the output signal to alter rapidly in response to the alteration in the pass-input signals, and enables the logic circuit itself to be implemented in a reduced area compared with the prior art CMOS-TG pass-transistor logic circuit.

As to the pass-transistor logic circuit of the first preferred embodiment according to the present invention, two-input one-output multiplexer circuit has been illustratively described, and the configuration of the pass-transistor logic circuit of the present invention can be applied to all the pass-transistor logic circuits comprised of any combinations of them.

The pass-transistor logic circuit of the first preferred embodiment according to the present invention in FIG. 1 has the inverter INV1 built therein, which produces the inverted signal S received as input signals by the second P channel MOS transistor PM2 and the second N channel MOS transistor NM2, and the inverted signal of the select input signal S may be the one supplied from an external source.

Furthermore, the pass-transistor logic circuit, which has the configuration that includes one of the second P channel MOS transistor PM2 and the second N channel MOS transistor NM2, can accomplish the similar effects as in the pass-transistor logic circuit of the first preferred embodiment according to the present invention to a certain extent.

Figure 2A:
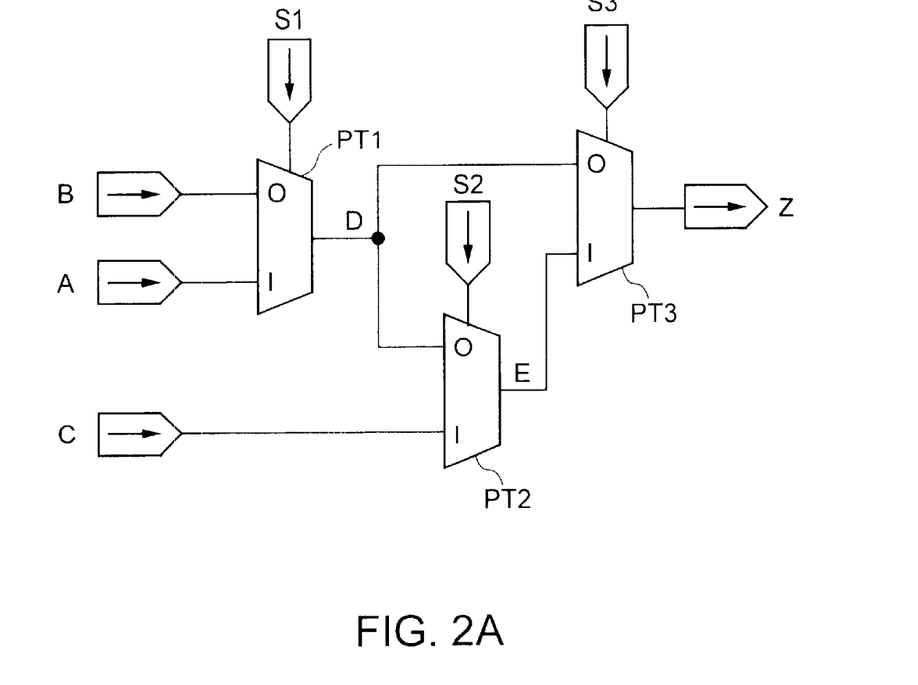
FIGS. 2A and 2B are circuit block diagrams illustrating an arrangement of a first modification of the pass-transistor logic circuit of the first preferred embodiment according to the present invention.
Figure 2B:
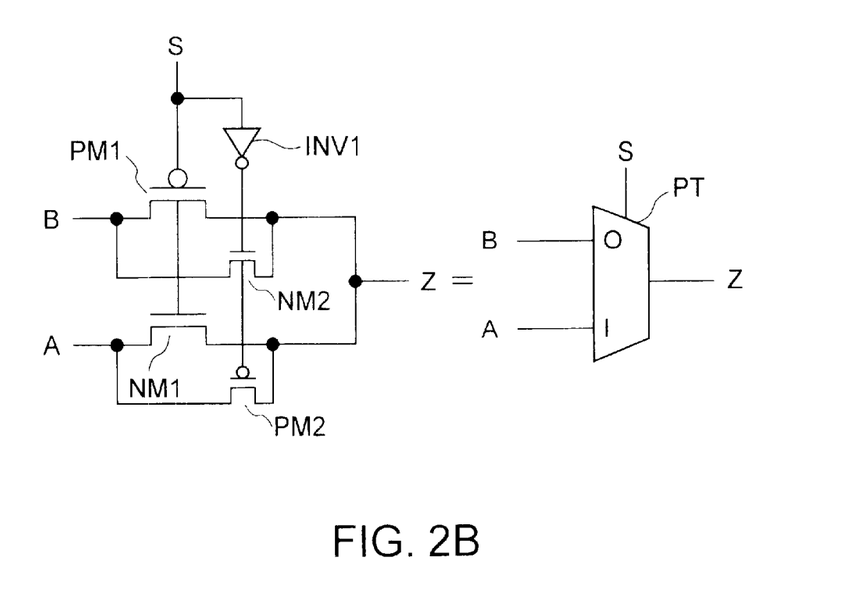

FIGS. 2A and 2B are circuit block diagrams illustrating a first modification of the pass-transistor logic circuit of the first preferred embodiment according to the present invention. Precisely, FIG. 2A is a block diagram depicting a configuration of the first modification of the pass-transistor logic circuit of the first preferred embodiment according to the present invention, and FIG. 2B, simplified from FIG. 2A, includes the pass-transistor logic circuit of the first preferred embodiment according to the present invention, denoted by a reference symbol PT.

The first modification of the pass-transistor logic circuit of the first preferred embodiment according to the present invention in FIGS. 2A and 2B comprises a first pass-transistor logic circuit PT1 receiving pass-input signals as designated by signals A and B, respectively, receiving a select input signal as designated by a signal S1, producing an output signal as designated by a signal D, a second pass-transistor logic circuit PT2 receiving pass-input signals as designated by signals C and D, receiving a select input signal as designated by signal S2, and producing an output signal as designated by a signal E, and a third pass-transistor logic circuit PT3 receiving pass-input signals as designated by signals D and E, receiving a select input signal as designated by a signal S3, and producing an output signal as designated by a signal Z.

The pass-transistor logic circuits PT1, PT2, and PT3 are all the pass-transistor logic circuits of the first preferred embodiment according to the present invention, and they are configured to satisfy the relations as expressed by the above mentioned inequalities in terms of the gate widths of the MOS transistors, or the components of each of the transistor logic circuits. The circuit comprised of any combinations of the pass-transistor logic circuits of the first embodiment according to the present invention can accomplish the similar effects as in the pass-transistor logic circuit of the first preferred embodiment according to the present invention.

Figure 3:
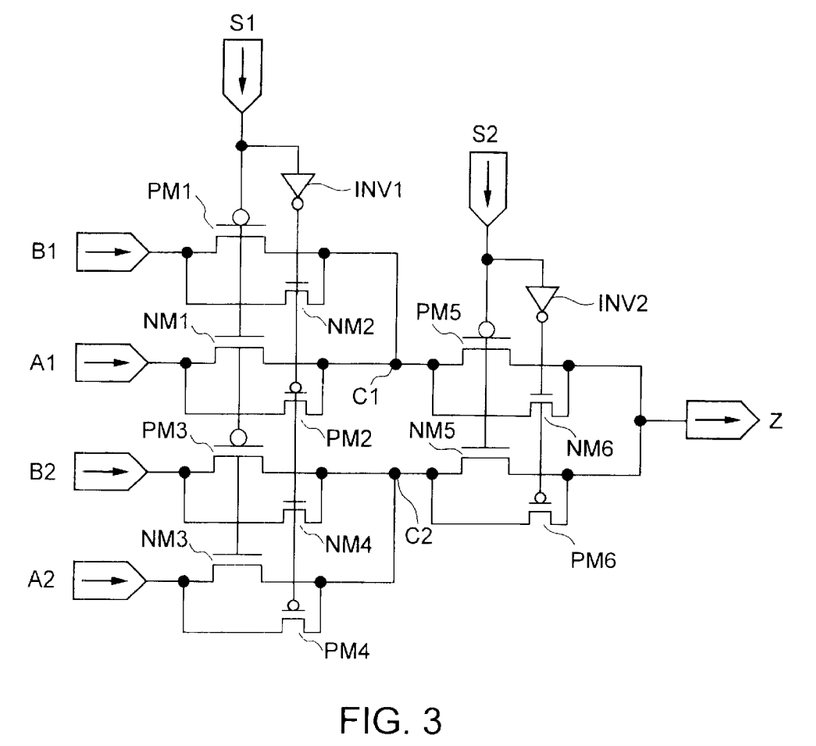
FIG. 3 is a circuit diagram illustrating an arrangement of a second modification of the pass-transistor logic circuit of the first preferred embodiment according to the present invention.

FIG. 3 is a circuit diagram showing an arrangement of a second modification of the pass-transistor logic circuit of the first preferred embodiment according to the present invention.

The second modification of the pass-transistor logic circuit of the first preferred embodiment according to the present invention comprises a first pass-transistor logic circuit receiving pass-input signals as designated by signals A1 and B1, receiving a select input signal as designated by a signal S1, and producing an output signal as designated by a signal C1, a second pass-transistor logic circuit receiving pass-input signals as designated by signals A2 and B2, receiving the select input signal as designated by the signal S1, and producing an output signal as designated by a signal C2, and a third pass-transistor logic circuit receiving the pass-input signals as designated by the signals C1 and C2, receiving a select input signal as designated by a signal S2, and producing an output signal as designated by a signal Z.

The first pass-transistor logic circuit comprises a first N channel MOS transistor NM1 having its drain connected to a pass signal input node A1, its gate connected to a select signal input node S1, and its source connected to a signal output node C1, a first P channel MOS transistor PM1 having its source connected to a pass signal input node B1, its gate connected to the select signal input node S1, and its drain connected to the signal output node C1, a second P channel MOS transistor PM2 in parallel connection with the first N channel MOS transistor NM1 and having its gate connected to the select signal input node S1 via an inverter INV1, and a second N channel MOS transistor NM2 in parallel connection with the first P channel MOS transistor PM1 and having its gate connected to the select signal input node S1 via the inverter INV1, and the first pass-transistor logic circuit is configured to satisfy the relations as expressed by the similar inequalities as in the above in terms of the gate widths of the MOS transistors.

A second pass-transistor logic circuit comprises a third N channel MOS transistor NM3 having its drain connected to a pass signal input node A2, its gate connected to the select signal input node S1, and its source connected to a signal output node C2, a third P channel MOS transistor PM3 having its source connected to a pass signal input node B2, its gate connected to the select signal input node S1, and its drain connected to the signal output node C2, a fourth P channel MOS transistor PM4 in parallel connection with the third N channel MOS transistor NM3 and having its gate connected to the select signal input node S1 via the inverter INV1, and a fourth N channel MOS transistor NM4 in parallel connection with the third P channel MOS transistor PM3 and having its gate connected to the select signal input node S1 via the inverter INV1, and the second pass-transistor logic circuit is configured to satisfy the relations as expressed by the similar inequalities as in the above in terms of the gate widths of the MOS transistors.

It is provided here that the third P channel MOS transistor PM3 and the third N channel MOS transistor NM3 correspond to the first N channel MOS transistor NM1 and the first P channel MOS transistor, respectively, while the fourth P channel MOS transistor PM4 and the fourth N channel MOS transistor NM4 correspond to the second N channel MOS transistor NM2 and the second P channel MOS transistor, respectively.

A third pass-transistor logic circuit comprises a fifth N channel MOS transistor NM5 having its drain connected to a pass signal input node C2, its gate connected to a select signal input node S2, and its source connected to a signal output node Z, a fifth P channel MOS transistor PM5 having its source connected to a pass signal input node C1, its gate connected to the select signal input node s2, and its drain connected to the signal output node Z, a sixth P channel MOS transistor PM6 in parallel connection with the fifth N channel MOS transistor NM5 and having its gate connected to the select signal input node S2 via an inverter INV2, a sixth N channel MOS transistor NM6 in parallel connection with the fifth P channel MOS transistor PM5 and having its gate connected to the select signal input node S2 via the inverter INV2, and the third pass-transistor logic circuit is configured to satisfy the relations as expressed by the similar inequalities as in the above in terms of the gate widths of the MOS transistors.

It is provided here that the fifth P channel MOS transistor PM5 and the fifth N channel MOS transistor NM5 correspond to the first N channel MOS transistor NM1 and the first P channel MOS transistor, respectively, while the sixth P channel MOS transistor PM6 and the sixth N channel MOS transistor NM6 correspond to the second N channel MOS transistor NM2 and the second P channel MOS transistor, respectively.

The second modification of the pass-transistor logic circuit of the first preferred embodiment according to the present invention has an arrangement where the first and second pass-transistor logic circuits share the inverter INV1 for producing the inverted signal of the select input signal S1, since the first and second pass-transistor logic circuits receive the common select input signal S1. Such a modification of the pass-transistor logic circuit of the first preferred embodiment according to the present invention can accomplish the similar effects as in the pass-transistor circuit of the first preferred embodiment according to the present invention.

Figure 4:
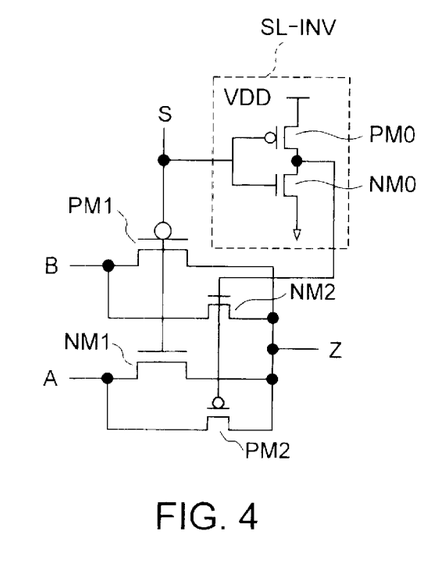
FIG. 4 is a circuit diagram illustrating an arrangement of pass-transistor logic circuit of a second preferred embodiment according to the present invention.

FIG. 4 is a circuit diagram illustrating an arrangement of the pass-transistor logic circuit of a second preferred embodiment according to the present invention.

The pass-transistor logic circuit of the second preferred embodiment according to the present invention in FIG. 4 comprises a first N channel MOS transistor NM1 having its drain connected to a pass signal input node A, its gate connected to a select signal input node S, and its source connected to a signal output node Z, a first P channel MOS transistor PM1 having its source connected to a pass signal input node B, its gate connected to the select signal input node S, and its drain connected to the signal output node Z, an inverter SL-INV for inverting the select input signal which is comprised of a P channel MOS transistor PM0 dedicated to the inverter and an N channel MOS transistor NM0 dedicated to the inverter connected in series with each other between a supply potential node VDD and a ground potential node GND, receiving the select input signal S at gates of the P channel MOS transistor PM0 and the N channel MOS transistor NM0, and producing an inverted signal of the select input signal S from drains of the P channel MOS transistor PM0 and N channel MOS transistor NM0, a second P channel MOS transistor PM2 in parallel connection with the first N channel MOS transistor NM1 and having its gate connected to an inverted signal output node of the inverter SL-INV for inverting the select input signal, and a second N channel MOS transistor NM2 in parallel connection with the first P channel MOS transistor PM1 and having its gate connected to the inverted signal output node of the inverter SL-INV for inverting the select input signal, and the pass-transistor logic circuit is configured to satisfy the relations as expressed by inequalities, $W_{NM1} > W_{PM2}$ and $W_{PM1} > W_{NM2}$, where $W_{NM1}$ and $W_{NM2}$ are gate widths of the first and second N channel MOS transistors NM1 and NM2, respectively, while $W_{PM1}$ and $W_{PM2}$ are gate widths of the first and second P channel MOS transistors PM1 and PM2, respectively, and also to satisfy the relation as expressed by an inequality, $(W_{PM0}/L_{PM0}) > 2 \times (W_{NM0}/L_{NM0})$, where $L_{PM0}$ and $W_{PM0}$ are a gate length and a gate width of the P channel MOS transistor PM0, respectively, while $L_{NM0}$ and $W_{NM0}$ are a gate length and a gate width of the N channel MOS transistor, respectively, and it is implemented in two-input one-output multiplexer circuit. The "MOS transistor dedicated to an inverter" is terms used herein simply for convenience and does not define any specific elements unless it is explained as such do.

Although the pass-transistor logic circuit of the second preferred embodiment according to the present invention is configured almost the same as the pass-transistor logic circuit of the first embodiment according to the present invention, it should be noteworthy that it is configured to satisfy the above conditions in terms of the gate lengths and gate widths of the MOS transistors which are components of the inverter SL-INV for inverting the select input signals.

Operations of the pass-transistor logic circuit of the first preferred embodiment according to the present invention will now be discussed, and, in its circuit arrangement, the first P channel MOS transistor PM1 and the second N channel MOS transistor NM2 transmit the pass-input signal B. Assuming that the pass-input signal A is at H level, the pass-input signal B is at L level, and the select input signal S is at H level, the output signal Z from the circuit is at H level. Subsequently, when the select input signal S is turned from H level to L level, the first P channel MOS transistor PM1 turns ON to transmit a L level signal to the signal output node Z.

However, in comparison with the N channel MOS transistor, the P channel MOS transistor is higher in ON resistance and is capable of transmitting only the L level signal of which output voltage has been dropped when it transmit the L level signal.

Thus, in order to transmit the L level signal with enhanced accuracy, the auxiliary second N channel MOS transistor NM2 must be turned ON earlier. For that purpose, the timing must be quickened at which the output signal from the inverter circuit for producing the inverted signal of the select input signal S turns from L level to H level.

Then, the pass-transistor logic circuit of the second preferred embodiment according to the present invention is adapted to raise a logical threshold value of the inverter SL-INV higher than VDD/2 to quickly turn, from L level to H level, the inverted signal of the select input signal S produced from the inverter SL-INV for inverting the select input signal when the select input signal S turns from H level to L level. Specifically, as mentioned above, the inverter SL-INV is configured to satisfy an inequality $(W_{PM0}/L_{PM0}) > 2 \times (W_{NM0}/L_{NM0})$ where $L_{PM0}$ and $W_{PM0}$ are a gate length and a gate width of the P channel MOS transistor PM0, respectively, while $L_{NM0}$ and $W_{NM0}$ are a gate length and a gate width of the N channel MOS transistor NM0.

The pass-transistor logic circuit of the second preferred embodiment according to the present invention is configured to cause delay in turning the inverted signal of the select input signal S from H level to L level upon the alteration in the select input signal S from L level to H level. As a result, since the second P channel MOS transistor PM2 is delayed turning ON, this may cause some trouble in transmitting H level signal through the first N channel MOS transistor NM1 from a point of view of the circuit arrangement. However, the N channel MOS transistor has reduced ON resistance and enhanced signal transmission ability in comparison with the P channel MOS transistor, and therefore, in practice, such latent trouble is totally negligible in contrast to the situation where L level signal is to be transmitted through the first P channel MOS transistor PM1.

As has been described, configuring the pass-transistor logic circuit to satisfy the relations as expressed by the inequalities $W_{NM1}>W_{PM2}$ and $W_{PM1}>W_{NM2}$ in terms of gate widths and gate lengths of the MOS transistors, or the components of the pass-transistor logic circuit allows the pass-transistor logic circuit to have enhanced grades of advantageous features of both the CMOS-TG pass-transistor logic circuit and NMOS pass-transistor logic circuit. Thus, the pass-transistor logic circuit of the second preferred embodiment according to the present invention enables the output signal to alter more quickly in response to the alteration in the select input signal, enables the output signal to alter more quickly in response to the alteration in the pass-input signals, and enables the pass-transistor logic circuit to be implemented in a reduced area compared with the prior art CMOS-TG pass-transistor logic circuit.

Figure 5:
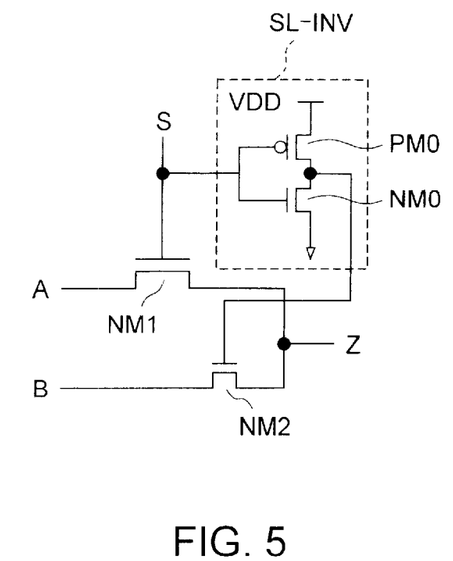
FIG. 5 is a circuit diagram illustrating an arrangement of a first modification of the pass-transistor logic circuit of the second preferred embodiment according to the present invention.

FIG. 5 is a circuit diagram illustrating an arrangement of a first modification of the pass-transistor logic circuit of the second preferred embodiment according to the present invention.

The first modification of the pass-transistor logic circuit of the second preferred embodiment according to the present invention in FIG. 5 comprises a first N channel MOS transistor NM1 having its drain connected to a pass signal input node A, its gate connected to a select signal input node S, and its source connected to a signal output node Z, an inverter SL-INV for inverting the select input signal comprised of a P channel MOS transistor PM0 dedicated to an inverter and an N channel MOS transistor NM0 dedicated to an inverter which are connected in series with each other between a supply potential node VDD and a ground potential node GND, receiving the select input signal S at gates of the P channel MOS transistor PM0 and the N channel MOS transistor NM0, respectively, and producing the inverted signal of the select input signal S from drains of the P channel MOS transistor PM0 and the N channel MOS transistor NM0, respectively, and a second N channel MOS transistor NM2 having its drain connected to a pass signal input node B, its gate connected to an inverted signal output node of the inverter SL-INV for inverting the select input signal, and its source connected to the signal output node Z, and the pass-transistor logic circuit is configured to satisfy the relation as expressed by an inequality $(W_{PM0}/L_{PM0})>2\times(W_{NM0}/L_{NM0})$ where $L_{PM0}$ and $W_{PM0}$ are a gate length and a gate width of the P channel MOS transistor, respectively, while $L_{NM0}$ and $W_{NM0}$ are a gate length and a gate width of the N channel MOS transistor NM0, to serve as multiplexer circuit.

Although the pass-transistor logic circuit of the second preferred embodiment according to the present invention in FIG. 4 uses the first N channel MOS transistor NM1 and the first P channel MOS transistor PM1 to serve as elements which primarily transmit the pass-input signals, the NMOS pass-transistor logic circuit which is the first modification of the pass-transistor logic circuit of the second preferred embodiment according to the present invention differs from the unmodified embodiment in that two of the N channel MOS transistors, i.e., the first and second N channel MOS transistors NM1 and NM2 are used to serve as the elements that transmit the pass-input signals.

However, the significant features of both the embodiments are completely the same, and the arrangements of those embodiments are adapted to quicken the timing at which the output signal from the inverter circuit for producing the inverted signal of the select input signal S is turned from L level to H level, allowing for necessities of quickly switching states as turning the second N channel MOS transistor NM2 from OFF to ON and turning the first N channel MOS transistor NM1 from ON to OFF.

Thus, similar to the pass-transistor logic circuit of the second preferred embodiment according to the present invention, the modification is adapted to raise a logical threshold of the inverter SL-INV for inverting the select input signal higher than VDD/2, and is adapted to quickly turning, from L level to H level, the inverted signal of the select input signal S produced from the inverter SL-INV for inverting the select input signal upon the alteration in the select input signal S from H level to L level. Specifically, as mentioned before, the modification of the present invention is configured to satisfy the relation as expressed by an inequality $(W_{PM0}/L_{PM0})>2\times(W_{NM0}/L_{NM0})$ where $L_{PM0}$ and $W_{PM0}$ are a gate length and a gate width of the P channel MOS transistor PM0, respectively, while $L_{NM0}$ and $W_{NM0}$ are a gate length and a gate width of the N channel MOS transistor NM0.

The first modification of the pass-transistor logic circuit of the second preferred embodiment according to the present invention also enables the output signal to alter quickly upon the alteration in the select input signal, enables the output signal to alter quickly upon the alteration in the pass-input signals, and enables the logic circuit itself to be implemented in a reduced area compared with the prior art CMOS-TG pass-transistor logic circuit.

Since an N channel MOS transistor can reduce ON resistance, enhance signal transmission ability, and also reduce the area where it is implemented, in contrast to a P channel MOS transistor, the N channel MOS transistor is ordinarily used when MOS transistors of the same conductivity type are used as two of pass-input signal transmission elements in the pass-transistor logic circuit. However, two of P channel MOS transistors are used, for some reason, to configure the pass-transistor logical circuit, the arangements of the present invention may similarly be applied. In such a situation, allowing for necessities of quickly switching states such as turning, from ON to OFF, the first P channel MOS transistor PM1 receiving the pass-input signal A and turning, from OFF to ON, the second P channel MOS transistor PM2 receiving the pass-input signal B, the pass-transistor logic circuit must be configured to satisfy the relation as expressed by an inequality $(W_{PM0}/L_{PM0})<2\times(W_{NM0}/L_{NM0})$ in terms of the gate lengths and gate widths of the P channel MOS transistor PM0 and N channel MOS transistor NM0, respectively.

Figure 6:
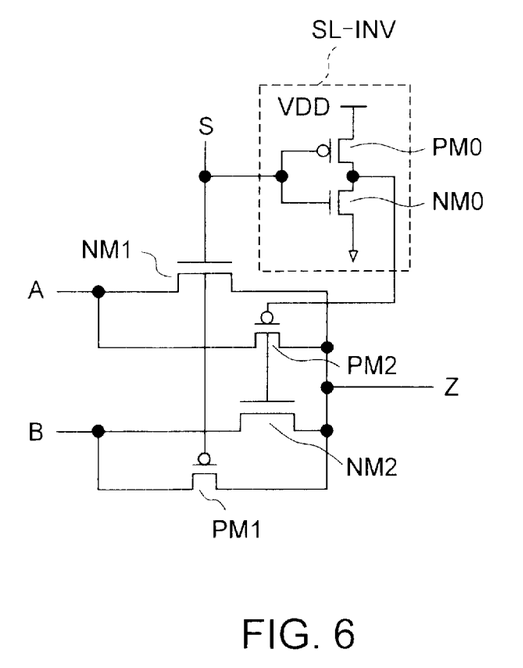
FIG. 6 is a circuit diagram illustrating an arrangement of a second modification of the pass-transistor logic circuit of the second preferred embodiment according to the present invention.

FIG. 6 is a circuit diagram illustrating an arrangement of a second modification of the pass-transistor logic circuit of the second preferred embodiment according to the present invention.

The second modification of the pass-transistor logic circuit of the second preferred embodiment according to the present invention in FIG. 6 comprises a first N channel MOS transistor NM1 having its drain connected to a pass signal input node A, its gate connected to a select signal input node S, and its source connected to a signal output node Z, an inverter SL-INV for inverting the select input signal comprised of a P channel MOS transistor PM0 dedicated to an inverter and an N channel MOS transistor NM0 dedicated to an inverter which are connected in series with each other between a supply potential node VDD and a ground potential node GND, receiving the select input signal S at the gates of the P channel MOS transistor PM0 and the N channel MOS transistor NM0, respectively, and producing the inverted signal of the select input signal S from drains of the P channel MOS transistor PM0 and the N channel MOS transistor NM0, respectively, a second N channel MOS transistor NM2 having its drain connected to a pass signal input node B, its gate connected to an inverted signal output node of the inverter SL-INV for inverting the select input signal, and its source connected to the signal output node Z, and a first P channel MOS transistor PM1 in parallel connection with the second N channel MOS transistor NM2 and having its gate connected to the select signal input node S, and a second P channel MOS transistor PM2 in parallel connection with the first N channel MOS transistor NM1 and having its gate connected to the inverted signal output node of the inverter SL-INV for inverting the select input signal, and the second modification is configured to satisfy the relations as expressed by inequalities, $W_{NM1}>W_{PM2}$ and $W_{NM2}>W_{PM1}$, where $W_{NM1}$ and $W_{NM2}$ are gate widths of the first and second N channel MOS transistors NM1 and NM2, respectively, while $W_{PM1}$ and $W_{PM2}$ are gate widths of the first and second P channel MOS transistors PM1 and PM2, respectively, and to further satisfy the relation as expressed by an inequality $(W_{PM0}/L_{PM0})>2\times(W_{NM0}/L_{NM0})$ where $L_{PM0}$ and $W_{PM0}$ are a gate length and a gate width of the P channel MOS transistor PM0, respectively, while $L_{NM0}$ and $W_{NM0}$ are a gate length and a gate width of the N channel MOS transistor NM0, respectively, to serve as two-input one-output multiplexer circuit.

The second modification of the pass-transistor logic circuit of the second preferred embodiment according to the present invention has an arrangement where first and second P channel MOS transistors PM1 and PM2 are added to effect auxiliary functions during pass-input signals transmission to the second and first N channel MOS transistors NM2 and NM1, respectively, which serve as the pass-input signal transmission elements in the first modification of the pass-transistor logic circuit of the second preferred embodiment according to the present invention, and the second modification serves as CMOS-TG pass-transistor logic circuit having the N channel MOS transistors serving as primary pass-input signal transmission elements.

That is, the second modification of the pass-transistor logic circuit of the second preferred embodiment according to the present invention is adapted to quicken the timing of the output signals from the inverter circuit for producing the inverted signals of the select input signals at which the output signals are turned from L level to H level, and has an arrangement where the first and second P channel MOS transistors PM1 and PM2 are added to effect auxiliary functions during the pass-input signals transmission to the second and first N channel MOS transistors NM2 and NM1, respectively, which serve as the pass-input signal transmission elements, allowing for necessities of quickly switching states as turning the first N channel MOS transistor NM1 from ON to OFF and turning the second N channel MOS transistor NM2 from OFF to ON, and also allowing for necessities of transmitting H level signals with enhanced accuracy through the first and second N channel MOS transistors NM1 and NM2, respectively.

More specifically, the second modification is configured in such a manner that the first and second P channel MOS transistors PM1 and PM2 are added to the second and first N channel MOS transistors NM2 and NM1, respectively, so as to satisfy the relations as expressed by inequalities, $W_{NM1}>W_{PM2}$ and $W_{NM2}>W_{PM1}$ in terms of their respective gate widths, and similar to the pass-transistor logic circuit of the second preferred embodiment according to the present invention, the second modification is adapted to raise a logical threshold value of the inverter SL-INV for inverting the select input signal higher than VDD/2, and hence adapted to quickly alter, from L level to H level, the inverted signal of the select input signal S produced from the inverter SL-INV for inverting the select input signal upon the alteration of the select input signal S from H level to L level.

And the second modification of the pass-transistor logic circuit is configured, as described above, to satisfy the relation as expressed by the inequality, $(W_{PM0}/L_{PM0})>2\times(W_{NM0}/L_{NM0})$, in terms of the gate lengths and gate widths of the MOS transistors dedicated to the inverter, in order to alter, from L level to H level, the inverted signal of the select input signal S produced from the inverter SL-INV for inverting the select input signal.

The second modification of the pass-transistor logic circuit of the second preferred embodiment according to the present invention also enables the output signal to quickly alter in response to the alteration in the select input signal, enables the output signal to quickly alter in response to the alteration in the pass-input signals, enables H level signal to be transmitted at enhanced accuracy, and further enables the pass-transistor logic circuit itself to be implemented in a reduced area in comparison with the prior art CMOS-TG pass-transistor logic circuit.

A plurality of sets of the pass-transistor logic circuits of the second preferred embodiment and its modifications according to the present invention can be combined to configure multiplexer circuit similarly as with the pass-transistor logic circuit of the first preferred embodiment according to the present invention, as shown in FIGS. 2 and 3. And furthermore, in the case as shown in FIG. 3, when there are a plurality of the multiplexer circuits that receive the common select input signals, those circuits can be arranged to share an inverter for producing the inverted signals of the select input signals.

What is claimed is:

1. A semiconductor integrated circuit comprising:
   a first MOS transistor of a first conductivity type having one of its source and drain connected to a first signal input node, having the other thereof connected to a signal output node, and receiving a select signal at its gate;
   a second MOS transistor of a second conductivity type in parallel connection with said first MOS transistor, and receiving an inverted signal of said select signal at its gate;
   a third MOS transistor of the second conductivity type having one of its source and drain connected to a second signal input node, having the other thereof connected to said signal output node, and receiving said select signal at its gate; and
   a fourth MOS transistor of the first conductivity type in parallel connection with said third MOS transistor and receiving said inverted signal at its gate,
   wherein said semiconductor integrated circuit being configured to satisfy the relation as expressed by an inequality W1>W2 where W1 and W2 are gate widths of said first and second MOS transistors, respectively, and said semiconductor integrated circuit being configured to satisfy the relation as expressed by an inequality W3>W4 where W3 and W4 are gate widths of said third and fourth MOS transistors, respectively.

2. A semiconductor integrated circuit according to claim 1, further comprising an inverter that produces said inverted signal.

3. A semiconductor integrated circuit according to claim 2, wherein said inverter is comprised of a fourth MOS transistor of the first conductivity type and a fifth MOS transistor of the second conductivity type connected in series with each other between a power supply potential node and a ground potential node, and receiving said select signal at their respective gates, said semiconductor integrated circuit being configured to satisfy the relation as expressed by an inequality (W5/L5)>2×(W4/L4) where W4 and W5 are gate widths of said fourth and fifth MOS transistors, respectively, while L4 and L5 are gate lengths thereof, respectively.

4. A semiconductor integrated circuit according to claim 3, wherein said first conductivity type is N channel type, while said second conductivity type is P channel type.

5. A semiconductor integrated circuit according to claim 1, further comprising an inverter that produces said inverted signal.

6. A semiconductor integrated circuit according to claim 5, wherein said inverter is comprised of a fifth MOS transistor of the first conductivity type and a sixth MOS transistor of the second conductivity type connected in series with each other between a power supply potential node and a ground potential node, and receiving said select signal at their respective gates, said semiconductor integrated circuit being configured to satisfy the relation as expressed by an inequality (W6/L6)>2×(W5/L5) where W5 and W6 are gate widths of said fifth and sixth MOS transistors, respectively, while L5 and L6 are gate lengths thereof, respectively.

7. A semiconductor integrated circuit according to claim 6, wherein said first conductivity type is N channel type, while said second conductivity type is P channel type.

8. A semiconductor integrated circuit comprising:

a first MOS transistor of a first conductivity type having one of its source and drain connected to a first signal input node, having the other thereof connected to a signal output node, and receiving a select signal at its gate;

an inverter comprised of a second MOS transistor of the first conductivity type and a third MOS transistor of a second conductivity type connected in series with each other between a power supply potential node and a ground potential node, receiving said select signal at their respective gates, and producing an inverted signal of said select signal;

a fourth MOS transistor of the first conductivity type having one of its source and drain connected to a second signal input node, having the other thereof connected to said signal output node, and receiving said inverted signal at its gate;

a fifth MOS transistor of the second conductivity type in parallel connection with said first MOS transistor and receiving said inverted signal at its gate; and a sixth MOS transistor of the second conductivity type in parallel connection with said fourth MOS transistor and receiving said select signal at its gate, wherein said semiconductor integrated circuit being configured to satisfy the relation as expressed by an inequality (W3/L3)>2×(W2/L2) where W2 and W3 are gate widths of said second and third MOS transistors, respectively, while L2 and L3 are gate lengths thereof, respectively, and said semiconductor integrated circuit is configured to satisfy the relations as expressed by inequalities W1>W5 and W4<W6 where W1, W4, W5 and W6 are gate widths of said first, fourth, fifth, and sixth MOS transistors, respectively.

9. A semiconductor integrated circuit according to claim 8, wherein said first conductivity type is N channel type, while said second conductivity type is P channel type.

10. A semiconductor integrated circuit according to claim 8, wherein said semiconductor integrated circuit is configured to satisfy the relations as expressed by inequalities W1>W5 and W4>W6 where W1, W4, W5 and W6 are gate widths of said first, fourth, fifth, and sixth MOS transistors, respectively.

11. A semiconductor integrated circuit comprising:

a first pass-transistor logic circuit receiving input signals as designated by signals A and B, receiving a select signal as designated by a signal S1, and producing an output signal as designated by a signal D;

a second pass-transistor logic circuit receiving input signals as designated by a signal C and the signal D, receiving a select signal as designated by a signal S2, and producing an output signal as designated by a signal E; and a third pass-transistor logic circuit receiving input signals as designated by the signals D and E, receiving a select signal as designated by a signal S3, and producing an output signal as designated by a signal Z;

said first, second, and third pass-transistor logic circuits including, respectively, a first MOS transistor of a first conductivity type having one of its source and drain connected to a first signal input node, having the other thereof connected to a signal output node, and receiving said select signal at its gate, a second MOS transistor of a second conductivity type in parallel connection with said first MOS transistor and receiving an inverted signal of said select signal at its gate, a third MOS transistor of the second conductivity type having one of its source and drain connected to a second signal input node, having the other thereof connected to said signal output node, and receiving said select signal at its gate, and a fourth MOS transistor of the first conductivity type in parallel connection with said third MOS transistor and receiving said inverted signal at its gate, said semiconductor integrated circuit being configured to satisfy the relations as expressed by inequalities W1>W2 where W1 and W2 are gate widths of said first and second MOS transistors, respectively, and W3>W4 where W3 and W4 are gate widths of said third and fourth MOS transistors, respectively.

12. A semiconductor integrated circuit according to claim 11, wherein said first, second, and third pass-transistor logic circuits include their respective inverters that produce said inverted signals.

13. A semiconductor integrated circuit according to claim 12, wherein said inverter is comprised of a fifth MOS transistor of the first conductivity type and a sixth MOS transistor of the second conductivity type connected in series with each other between a power supply potential node and a ground potential node, and receiving said select signal at their respective gates, said semiconductor integrated circuit being configured to satisfy the relation as expressed by an inequality (W6/L6)>2×(W5/L5) where W5 and W6 are gate widths of said fifth and sixth MOS transistors, respectively, while L5 and L6 are gate lengths thereof, respectively.

14. A semiconductor integrated circuit comprising:

a first pass-transistor logic circuit receiving input signals as designated by signals A1 and B1, receiving a select signal as designated by a signal S1, and producing an output signal as designated by a signal C1;

a second pass-transistor logic circuit receiving input signals as designated by signals A2 and B2, receiving a select signal as designated by the signal S1, and producing an output signal as designated by a signal C2; and a third pass-transistor logic circuit receiving input signals as designated by the signals C1 and C2, receiving a select signal as designated by a signal S2, and producing an output signal as designated by a signal Z;

said first, second, and third pass-transistor logic circuits including, respectively, a first MOS transistor of a first conductivity type having one of its source and drain connected to a first signal input node, having the other thereof connected to a signal output node, and receiving said select signal at its gate, a second MOS transistor of a second conductivity type in parallel connection with said first MOS transistor and receiving an inverted signal of said select signal at its gate, a third MOS transistor of the second conductivity type having one of its source and drain connected to a second signal input node, having the other thereof connected to said signal output node, and receiving said select signal at its gate, and a fourth MOS transistor of the first conductivity type in parallel connection with said third MOS transistor and receiving said inverted signal at its gate, said semiconductor integrated circuit being configured to satisfy the relations as expressed by inequalities W1>W2 where W1 and W2 are gate widths of said first and second MOS transistors, respectively, and W3>W4 where W3 and W4 are gate widths of said third and fourth MOS transistors, respectively.

15. A semiconductor integrated circuit according to claim 14, wherein said first and second pass-transistor logic circuits include an inverter that is shared by them and produces said inverted signals.

16. A semiconductor integrated circuit according to claim 15, wherein said inverter is comprised of a fifth MOS transistor of the first conductivity type and a sixth MOS transistor of the second conductivity type connected in series with each other between a power supply potential node and a ground potential node, and receiving said select signal at their respective gates, said semiconductor integrated circuit being configured to satisfy the relation as expressed by an inequality (W6/L6)>2×(W5/L5) where W5 and W6 are gate widths of said fifth and sixth MOS transistors, respectively, while L5 and L6 are gate lengths thereof, respectively.

* * * * *